(12) United States Patent
Bauer et al.

(10) Patent No.: US 10,553,748 B2
(45) Date of Patent: Feb. 4, 2020

(54) SEMICONDUCTOR COMPONENT AND ILLUMINATION DEVICE

(71) Applicant: OSRAM Opto Semiconductors GmbH, Regensburg (DE)

(72) Inventors: Adam Bauer, Donaustauf (DE); Wolfgang Mönch, Pentling (DE); David Racz, Regensburg (DE); Michael Wittmann, Alteglofsheim (DE); Dominik Schulten, Regensburg (DE); Andreas Löffler, Neutraubling (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 3 days.

(21) Appl. No.: 15/307,815

(22) PCT Filed: May 22, 2015

(86) PCT No.: PCT/EP2015/061388
§ 371 (c)(1),
(2) Date: Oct. 29, 2016

(87) PCT Pub. No.: WO2015/181072
PCT Pub. Date: Dec. 3, 2015

(65) Prior Publication Data
US 2017/0054054 A1    Feb. 23, 2017

(30) Foreign Application Priority Data

May 27, 2014 (DE) .................. 10 2014 107 472

(51) Int. Cl.
*H01L 33/06* (2010.01)
*H01L 33/50* (2010.01)
(Continued)

(52) U.S. Cl.
CPC .............. *H01L 33/06* (2013.01); *H01L 33/30* (2013.01); *H01L 33/32* (2013.01); *H01L 33/502* (2013.01);
(Continued)

(58) Field of Classification Search
CPC ................... H01L 31/03046; H01L 31/03048
See application file for complete search history.

(56) References Cited

U.S. PATENT DOCUMENTS 6,730,943 B2   5/2004 Massies et al.
7,402,831 B2   7/2008 Miller et al.
(Continued)

FOREIGN PATENT DOCUMENTS

CN   101038947 A   9/2007
CN   101076897 A   11/2007
(Continued)

*Primary Examiner* — Charles D Garber
*Assistant Examiner* — Xiaoming Liu
(74) *Attorney, Agent, or Firm* — Slater Matsil, LLP

(57) ABSTRACT

A semiconductor component and an illumination device is disclosed. In an embodiment the semiconductor component includes a semiconductor chip configured to generate a primary radiation having a first peak wavelength and a radiation conversion element arranged on the semiconductor chip. The radiation conversion element includes a quantum structure that converts the primary radiation at least partly into secondary radiation having a second peak wavelength and a substrate that is transmissive to the primary radiation.

23 Claims, 10 Drawing Sheets

(51) Int. Cl.
*H01L 33/62* (2010.01)
*H01L 33/30* (2010.01)
*H01L 33/32* (2010.01)
*H01L 33/56* (2010.01)
*H01L 33/58* (2010.01)
*H01L 33/60* (2010.01)
*G02F 1/1335* (2006.01)

(52) U.S. Cl.
CPC .............. *H01L 33/56* (2013.01); *H01L 33/58* (2013.01); *H01L 33/60* (2013.01); *H01L 33/62* (2013.01); *G02F 1/133524* (2013.01); *G02F 1/133603* (2013.01); *H01L 2933/0091* (2013.01)

(56) References Cited

U.S. PATENT DOCUMENTS

| | | | |
|---|---|---|---|
| 7,902,542 B2 | 3/2011 | Haase et al. | |
| 8,217,400 B2 | 7/2012 | Huang et al. | |
| 8,394,652 B2 | 3/2013 | Minato et al. | |
| 8,426,843 B2 | 4/2013 | Albrecht et al. | |
| 8,470,618 B2 | 6/2013 | Massies et al. | |
| 8,710,533 B2 | 4/2014 | Haase et al. | |
| 8,841,684 B2 | 9/2014 | Ishihara et al. | |
| 8,877,526 B2 | 11/2014 | Ono et al. | |
| 2004/0217364 A1* | 11/2004 | Tarsa ................ H01L 25/0753 257/89 | |
| 2007/0057269 A1 | 3/2007 | Ueda | |
| 2007/0120129 A1 | 5/2007 | DenBaars et al. | |
| 2009/0140272 A1 | 6/2009 | Beeson et al. | |
| 2009/0321781 A1* | 12/2009 | Broadley ............ B82Y 10/00 257/103 | |
| 2010/0066236 A1* | 3/2010 | Xu ....................... H01L 33/505 313/498 | |
| 2010/0117997 A1* | 5/2010 | Haase ................. H01L 27/156 345/204 | |
| 2011/0101403 A1 | 5/2011 | Haase et al. | |
| 2012/0074380 A1 | 3/2012 | Wang et al. | |
| 2012/0097983 A1 | 4/2012 | Smith et al. | |
| 2012/0248412 A1* | 10/2012 | Mitin ................... B82Y 10/00 257/21 | |
| 2013/0001605 A1 | 1/2013 | Ishihara et al. | |
| 2013/0049569 A1 | 2/2013 | Schubert et al. | |
| 2014/0217430 A1 | 8/2014 | Cui et al. | |
| 2014/0264419 A1* | 9/2014 | Kim ..................... H01L 33/504 257/98 | |
| 2014/0285088 A1* | 9/2014 | Windisch ............ H01L 25/0753 315/113 | |
| 2015/0022762 A1 | 1/2015 | Stoll et al. | |
| 2015/0041755 A1* | 2/2015 | Zhang .................... H01L 33/12 257/13 | |
| 2015/0197689 A1* | 7/2015 | Tani ..................... C09K 11/025 362/84 | |
| 2015/0200339 A1 | 7/2015 | Markytan et al. | |
| 2015/0207043 A1 | 7/2015 | Pfeuffer et al. | |

FOREIGN PATENT DOCUMENTS

| | | |
|---|---|---|
| CN | 102804422 A | 11/2012 |
| DE | 10354936 A1 | 4/2005 |
| DE | 102011106478 A1 | 1/2013 |
| DE | 102011113802 A1 | 3/2013 |
| DE | 102011113963 A1 | 3/2013 |
| DE | 102012106859 A1 | 1/2014 |
| DE | 102012107290 A1 | 2/2014 |
| EP | 1132977 A2 | 9/2001 |
| EP | 2568514 A2 | 3/2013 |
| JP | 200519981 A | 1/2005 |
| JP | 2008177528 A | 7/2008 |
| JP | 2008523615 A | 7/2008 |
| JP | 2009540614 A | 11/2009 |
| JP | 2012124257 A | 6/2012 |
| JP | 201316588 A | 1/2013 |
| WO | 0229906 A2 | 4/2002 |
| WO | 2005124877 A2 | 12/2005 |
| WO | 2006062588 A1 | 6/2006 |
| WO | 2007146709 A2 | 12/2007 |
| WO | 2009039815 A1 | 4/2009 |

* cited by examiner

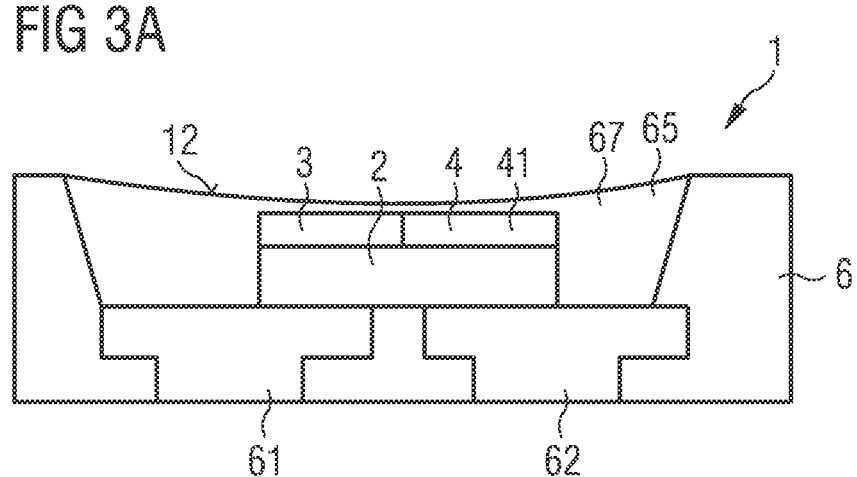
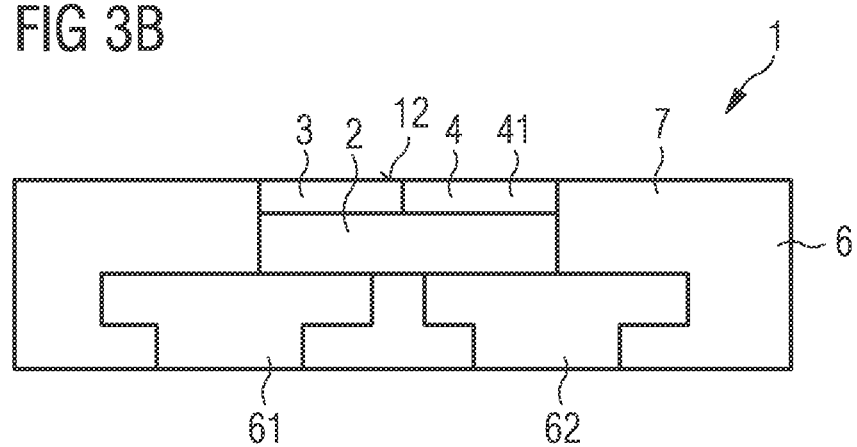

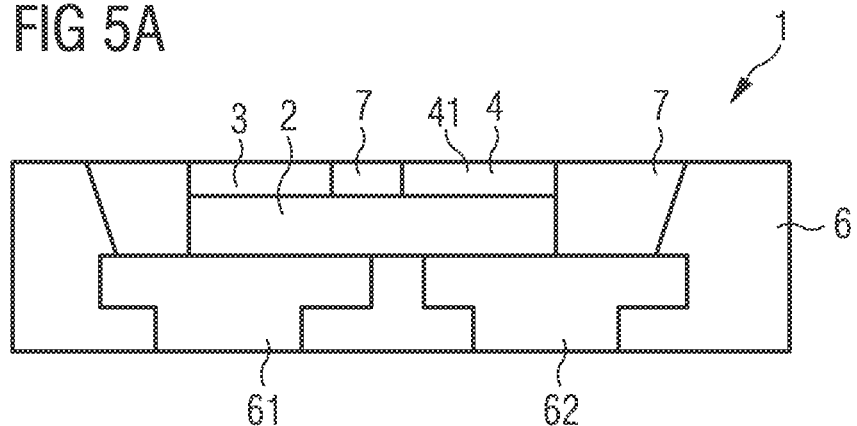
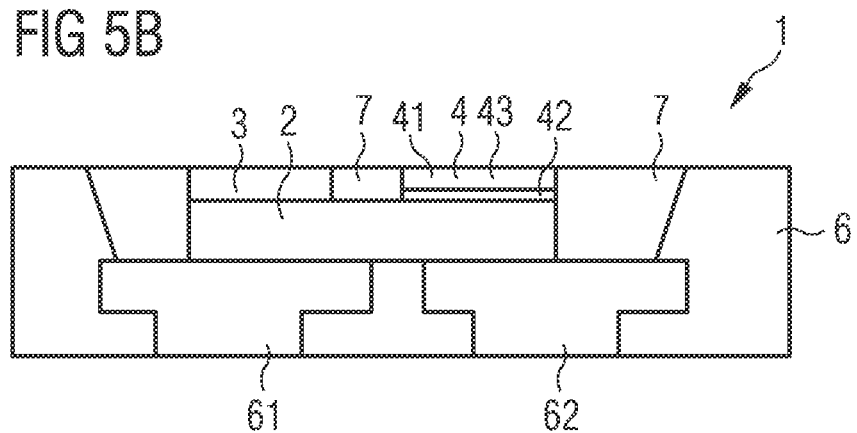
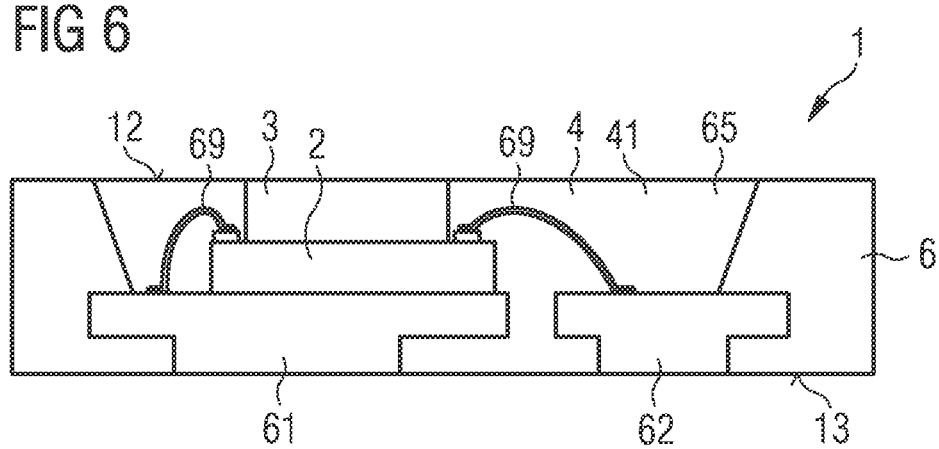

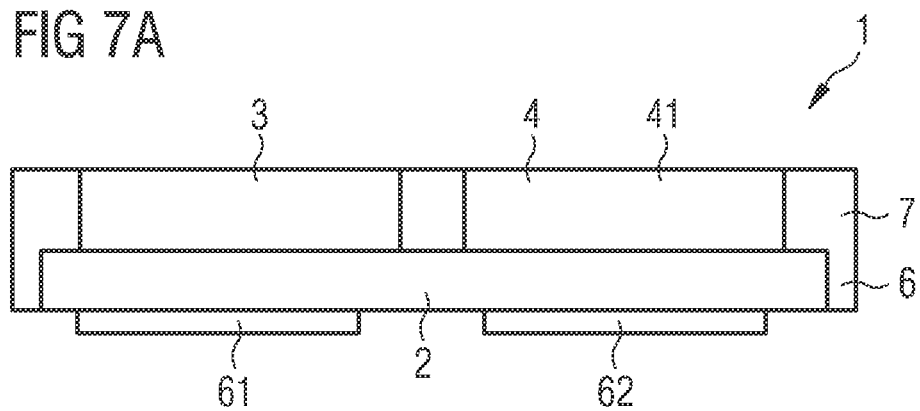
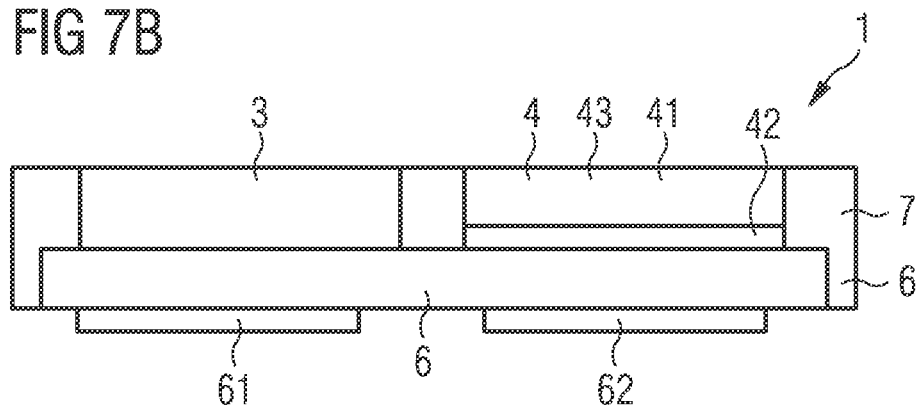

SEMICONDUCTOR COMPONENT AND ILLUMINATION DEVICE

This patent application is a national phase filing under section 371 of PCT/EP2015/061388, filed May 22, 2015, which claims the priority of German patent application 10 2014 107 472.6, filed May 27, 2014, each of which is incorporated herein by reference in its entirety.

TECHNICAL FIELD

The present application relates to a semiconductor component and to an illumination device.

BACKGROUND

For the backlighting of a display device, for example liquid crystal displays (LCDs), light emitting diodes can be used as radiation sources. However, such applications require a high gamut in order to be able to represent the greatest possible proportion of the colors perceptible to the human eye. By way of example, by means of LEDs that emit in the blue spectral range and a phosphor that emits in the yellow spectral range, radiation that appears white to the human eye can be generated with high efficiency, but with a reduced gamut. By adding further phosphors, the gamut can be improved but the efficiency decreases. A high color gamut can furthermore be achieved if three mutually different light emitting diodes directly generate radiation in the red, blue and green spectral ranges. However, this requires a complex electronic control on account of the driving of three individual colors.

SUMMARY OF THE INVENTION

Embodiments provide mixed radiation with high efficiency.

In accordance with at least one embodiment of the semiconductor component, the semiconductor component comprises a semiconductor chip provided for generating a primary radiation having a first peak wavelength. The first peak wavelength is in the ultraviolet or blue spectral range, for example. By way of example, the semiconductor chip comprises an active region provided for generating the first peak wavelength. The active region is for example part of a semiconductor body comprising a semiconductor layer sequence deposited for example epitaxially on a growth substrate. By way of example, the semiconductor chip comprises a carrier, on which the semiconductor body comprising the semiconductor layer sequence with the active region is arranged. The carrier mechanically stabilizes the semiconductor body. The carrier can be the growth substrate for the semiconductor layer sequence. Alternatively, the carrier can be different than a growth substrate for the semiconductor layer sequence.

The semiconductor chip expediently comprises a first connection area and a second connection area for electrically contacting the semiconductor chip. The first connection area and the second connection area can be arranged on the same side of the semiconductor chip or on opposite sides of the semiconductor chip.

In accordance with at least one embodiment of the semiconductor component, the semiconductor component comprises a radiation conversion element, which converts the primary radiation at least partly into secondary radiation having a second peak wavelength. The secondary radiation has, in particular, a greater peak wavelength than the primary radiation. By way of example, the second peak wavelength is in the green, yellow or red spectral range.

In particular, the radiation conversion element is provided for only partly converting the primary radiation of the semiconductor chip, such that the semiconductor component emits overall a mixed radiation comprising the primary radiation and the secondary radiation. By way of example, the mixed radiation is light that appears white to the human eye.

In accordance with at least one embodiment of the semiconductor component, the radiation conversion element comprises a quantum structure, which converts the primary radiation at least partly into secondary radiation having the second peak wavelength.

In the context of the application, the designation quantum structure encompasses in particular any structure in which charge carriers may experience a quantization of their energy states as a result of confinement. In particular, the designation quantum structure does not include any indication about the dimensionality of the quantization. It therefore encompasses, inter alia, quantum wells, quantum wires and quantum dots and any combination of these structures.

By way of example, the quantum structure comprises a plurality of quantum layers between which barrier layers are arranged. For example, the quantum layers and the barrier layers form a multi quantum well (MQW) structure. The radiation conversion element comprises for example a substrate, which is transmissive to the primary radiation. The substrate serves in particular for mechanically stabilizing the quantum structure. By way of example, the substrate is at least five times as thick as the quantum structure. The substrate can be a growth substrate for the for example epitaxial deposition of the quantum structure. Alternatively, the substrate can also be different than the growth substrate for the quantum structure. The semiconductor component can also comprise more than one such radiation conversion element. By way of example, two or more radiation conversion elements which emit radiation having the same peak wavelength can be arranged one above another. The efficiency of the radiation conversion can thus be increased.

The substrate of the radiation conversion element covers the semiconductor chip in particular over a large area, for example to the extent of at least 20% or to the extent of at least 50% in a plan view of the semiconductor chip. The substrate can cover the semiconductor chip as much as completely.

In at least one embodiment of the semiconductor component, the semiconductor component comprises a semiconductor chip provided for generating a primary radiation having a first peak wavelength, and a radiation conversion element arranged on the semiconductor chip. The radiation conversion element comprises a quantum structure, which converts the primary radiation at least partly into secondary radiation having a second peak wavelength. Furthermore, the radiation conversion element comprises a substrate, which is transmissive to the primary radiation.

In accordance with at least one embodiment of the semiconductor component, the radiation conversion element contains $Al_xIn_yGa_{1-x-y}N$, $Al_xIn_yGa_{1-x-y}P$ or $Al_xIn_yGa_{1-x-y}As$. It holds true here in each case that $0 \le x \le 1$, $0 \le y \le 1$ and $x+y \le 1$. Radiation in the green, yellow or red spectral range can be generated efficiently with these materials. In principle, however, any semiconductor material whose band gap is suitable for generating secondary radiation having the second peak wavelength to be generated is suitable for the radiation conversion element.

In accordance with at least one embodiment of the semiconductor component, the first peak wavelength is less than the second peak wavelength. By way of example, the first peak wavelength is in the blue spectral range and the second peak wavelength is in the green, red or yellow spectral range. By way of example, the first peak wavelength is in the blue spectral range and the second peak wavelength is in the green spectral range. Radiation in the green spectral range is therefore not generated by means of a semiconductor chip that emits in the green spectral range, but rather by means of a radiation conversion.

In accordance with at least one embodiment of the semiconductor component, the semiconductor component comprises an emitter for emitting a third peak wavelength. The term "emitter" generally denotes an element that emits radiation upon excitation. The excitation can be effected electrically or optically, for example.

The first peak wavelength, the second peak wavelength and, if appropriate, the third peak wavelength are expediently mutually different in each case. By way of example, a difference between the peak wavelengths is at least 50 nm in each case.

By way of example, a respective one of the first, second and third peak wavelengths is in the blue spectral range, in the green spectral range and in the red spectral range. In the case of a first peak wavelength in the blue spectral range and a second peak wavelength in the green spectral range, the third peak wavelength is in the red spectral range, for example.

In accordance with at least one embodiment of the semiconductor component, the semiconductor component comprises a reflector layer. The reflector layer contains for example a polymer material filled with reflective particles. By way of example, the particles contain titanium dioxide, zirconium oxide or aluminum oxide. The reflector layer has a reflectivity of at least 80% for example for the peak wavelength of the primary radiation.

By way of example, the reflector layer is molded onto the semiconductor chip and/or onto the radiation conversion element. By way of example, the reflector layer at least regionally adjoins the semiconductor chip and/or the radiation conversion element directly. The reflector layer is producible for example by means of a molding method. A molding method is understood generally to mean a method by which a molding compound can be configured in accordance with a predefined shape and hardened as necessary. In particular, the term molding method encompasses molding (casting), injection molding, transfer molding, compression molding and foil assisted molding.

In accordance with at least one embodiment of the semiconductor component, the reflector layer is arranged in a beam path between the emitter and the radiation conversion element. The reflector layer thus prevents a direct beam path between the emitter and the radiation conversion element. Absorption losses within the semiconductor component, for example as a result of absorption of the radiation having the second peak wavelength in the emitter and/or radiation having the third peak wavelength in the radiation conversion element, are thus avoided or at least reduced.

In accordance with at least one embodiment of the semiconductor component, the emitter is a further radiation conversion element. By way of example, the further radiation conversion element comprises a phosphor for generating the radiation having the third peak wavelength. Alternatively, the emitter can comprise a further quantum structure for generating the radiation having the third peak wavelength. The further quantum structure can be embodied in particular as described in association with the quantum structure, wherein the quantum structure and the further quantum structure expediently emit in mutually different spectral ranges.

In accordance with at least one embodiment of the semiconductor component, the radiation conversion element and the further radiation conversion element are arranged alongside one another on the semiconductor chip. The radiation conversion elements are arranged in particular in a manner free of overlap alongside one another on the semiconductor chip. The radiation conversion element and the further radiation conversion element can adjoin one another or be spaced apart from one another. By way of example, the reflector layer is arranged between the radiation conversion element and the further radiation conversion element.

In accordance with at least one embodiment of the semiconductor component, the radiation conversion element and the further radiation conversion element are arranged one above the other on the semiconductor chip.

In a configuration in which the further radiation conversion element comprises a further quantum structure, the radiation conversion element can comprise a further substrate. The radiation conversion element and the further radiation conversion element can thus be produced independently of one another during production and subsequently be arranged one on top of the other or alongside one another. Alternatively, the radiation conversion element and the further radiation conversion element can comprise a common substrate. By way of example, the quantum structure and the further quantum structure may be integrated into a common semiconductor layer sequence or at least successively be deposited epitaxially on a common substrate.

In accordance with at least one embodiment of the semiconductor component, the semiconductor component comprises a further semiconductor chip. By way of example, the further radiation conversion element is arranged on the further semiconductor chip. The radiation generated by the further semiconductor chip can be identical to the primary radiation of the semiconductor chip. Alternatively, the peak wavelength of the further radiation can be different than the first peak wavelength of the primary radiation.

In accordance with at least one embodiment of the semiconductor component, the further radiation conversion element is formed by a phosphor embedded into an encapsulation of the semiconductor chip. The encapsulation contains for example a polymer material that is transmissive to the primary radiation, for instance an epoxy or a silicone.

During the production of the semiconductor component, the encapsulation is formed for example by means of a molding compound that is molded onto the semiconductor chip, which in particular has already been electrically contacted.

In accordance with at least one embodiment of the semiconductor component, the emitter is the further semiconductor chip. By way of example, the further semiconductor chip has an active region for generating the third peak wavelength. By way of example, the active region of the further semiconductor chip contains $Al_xIn_yGa_{1-x-y}P$ or $Al_xIn_yGa_{1-x-y}As$, in each case where $0 \leq x \leq 1$, $0 \leq y \leq 1$ and $x+y \leq 1$.

In accordance with at least one embodiment of the semiconductor component, the further semiconductor chip and the semiconductor chip are embedded into a reflector layer. A body that is radiation-transmissive to the third peak wavelength is arranged on the further semiconductor chip. The reflector layer adjoins the radiation-transmissive body and the radiation conversion element. The radiation-transmissive body and the radiation conversion element are at least regionally free of the reflector layer on an emission side of the semiconductor component. In a vertical direction, that is to say in a direction running perpendicular to a main extension plane of the active region of the semiconductor chip, the radiation conversion element and the radiation-transmissive body end for example at the same height or substantially at the same height, for example with a deviation of at most 50 µm. The process of forming the reflector layer is simplified as a result.

In accordance with at least one embodiment of the semiconductor component, a dielectric coating is arranged on the radiation conversion element. The dielectric coating comprises for example a plurality of dielectric layers, wherein layers adjoining one another in each case have mutually different refractive indices. The dielectric coating has for example a wavelength-selective transmission. The transmission is thus greater for one spectral range than for another spectral range. By way of example, the dielectric coating is designed to be reflective for at least one radiation portion, for example the primary radiation or part of the primary radiation. Alternatively or supplementarily, the emitted spectrum can be prefiltered by means of the dielectric coating, for example with regard to specific customer requirements.

In accordance with at least one embodiment of the semiconductor component, a scattering layer is arranged on the radiation conversion element. By way of example, the scattering layer is arranged on the side of the radiation conversion element facing away from the semiconductor chip. The scattering layer contains for example scattering particles having a concentration of between 10% by weight and 30% by weight inclusive, for example between 15% by weight and 25% by weight inclusive. A layer thickness of the scattering layer is for example between 10 µm and 30 µm inclusive. The scattering particles contain for example titanium dioxide, aluminum oxide or zirconium oxide.

In accordance with at least one embodiment of the semiconductor component, the quantum structure is arranged on the side of the substrate facing the semiconductor chip. The heat loss arising in the quantum structure can thus be dissipated via the semiconductor chip. In a departure from this, the quantum structure can also be arranged on the side of the substrate facing away from the semiconductor chip.

In accordance with at least one embodiment of the semiconductor component, the radiation conversion element has a coupling-out structure. The coupling-out structure is provided for increasing the coupling-out of radiation from the radiation conversion element. By way of example, the coupling-out structure is arranged on the side of the substrate facing the quantum structure. By way of example, the coupling-out structure is formed by means of a structured growth area of the substrate. Furthermore, the coupling-out structure can be arranged on the side of the quantum structure facing away from the substrate. Alternatively, the coupling-out structure can be arranged on the side of the substrate facing away from the quantum structure. By way of example, the coupling-out structure is embodied in the form of a roughening of the substrate.

In accordance with at least one embodiment of the semiconductor component, the semiconductor component is embodied as a surface-mountable component (surface mounted device, SMD). The semiconductor component comprises, in particular on the mounting area facing away from the emission side, at least two contacts for the external electrical contacting of the semiconductor component.

An illumination device in accordance with at least one embodiment comprises at least one semiconductor component and a connection carrier, on which the semiconductor component is arranged. The connection carrier can be a printed circuit board, for example. The semiconductor component can have one or more of the features mentioned above.

In accordance with at least one embodiment of the illumination device, the illumination device is designed for the backlighting of a display device, for a projection, for a flashlight or for a spotlight/headlight.

In particular the following effects can be achieved with the described semiconductor component and the illumination device.

A radiation conversion element having a quantum structure grown epitaxially, in particular, can be distinguished by a high thermal stability. By way of example, secondary radiation in the red spectral range or in the green spectral range can have the high thermal stability of a light emitting diode based on nitride compound semiconductor material, in particular on $Al_xIn_yGa_{1-x-y}N$. Furthermore, in the case of such a radiation conversion element, the emission wavelength is settable in a simple manner, in particular by the variation of the layer thicknesses and the materials of the quantum structure. The degree of conversion is settable in a simple and reliable manner by means of the number of quantum layers. As an alternative to an epitaxial deposition, some other deposition method is also conceivable, for example sputtering. Photoluminescent structures can thus be produced particularly cost-effectively.

Furthermore, it has been found that the optical excitation of a quantum structure that emits in the green spectral range, for example on the basis of $Al_xIn_yGa_{1-x-y}N$, is more efficient than a direct radiation generation in such a quantum structure by electrical excitation.

Furthermore, compared with radiation conversion elements comprising phosphors, a spectrally narrowband emission, for example having a full width at half maximum (FWHM) of approximately 30 nm, may be achieved while phosphors typically bring about an emission with a full width at half maximum of between approximately 50 and 100 nm. As a result, a higher color purity can be achieved, as a result of which a high gamut is achievable with high efficiency.

Moreover, a spatial separation between the radiation conversion and the scattering of the radiation can be effected in the radiation conversion element, for example by a radiation conversion in the quantum structure and a scattering by a coupling-out structure of the substrate, for instance on the emission side.

Radiation conversion elements having a quantum structure can furthermore be distinguished by a small layer thickness. While radiation conversion elements comprising phosphors typically have a layer thickness of approximately 100 µm, with a radiation conversion element having a quantum structure a layer thickness of less than 1 µm, for example between 100 nm and 1 µm, may be achieved. The heat loss arising during operation can thus be dissipated more efficiently.

Furthermore, it is possible to shorten iteration cycles during the production of new semiconductor components in the development phase, in particular by virtue of the flexible adaptability of the radiation conversion element.

The side of the substrate facing away from the quantum structure can furthermore fulfill additional optical functions, for example the function of an in particular wavelength-selective mirror or filter, and/or the function of a coupling-out structure, for example of a roughening.

The semiconductor component furthermore comprises at least two radiation sources which emit in a narrowband fashion in particular in comparison with conversion elements based on phosphors, namely the semiconductor chip and the conversion element having the quantum structure. A high gamut can thus be achieved in a simplified manner. Furthermore, the emission spectrum of the semiconductor component is adaptable in a simple and reliable manner already just by the adaptation of the radiation conversion element, for instance of the layer sequence and/or of the layer thicknesses, to customer-specific requirements.

Furthermore, the emission characteristic can be modified in a simple manner, for example for generating a spatially directed emission.

Scattering layers or structures of the semiconductor component furthermore bring about an efficient color mixing. By means of a dielectric coating, for example, a wavelength-selective coupling-out and/or the formation of a resonant cavity for the generated radiation and/or a prefiltering of the spectrum of the semiconductor component can be achieved in a simple and reliable manner.

Moreover, an efficient coupling into the radiation conversion element and/or an efficient coupling-out from the semiconductor component can be achieved in a simple manner, for example by means of a structure which is formed in the substrate and which brings about a refractive index gradient.

BRIEF DESCRIPTION OF THE DRAWINGS

Further configurations and expediences will become apparent from the following description of the exemplary embodiments in association with the figures.

In the figures:

FIGS. 3A, 3B, 4A, 4B, 5A, 5B, 6, 7A, 7B, 8A, 8B, 8C and 8D in each case show an exemplary embodiment of a semiconductor component;

Elements that are identical, of identical type or act identically are provided with identical reference signs in the figures.

The figures are in each case schematic illustrations and therefore not necessarily true to scale. Rather, comparatively small elements and in particular layer thicknesses may be illustrated with exaggerated size for the purpose of elucidation.

DETAILED DESCRIPTION OF ILLUSTRATIVE EMBODIMENTS

Figure 1A:
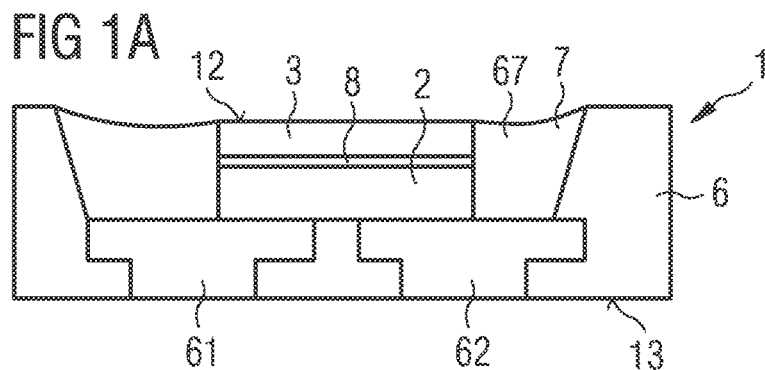
FIG. 1A shows one exemplary embodiment of a semiconductor component in schematic sectional view.

FIG. 1A shows one exemplary embodiment of a semiconductor component in schematic sectional view. The semiconductor component 1 comprises a semiconductor chip 2 provided for generating a primary radiation having a first peak wavelength. The first peak wavelength of the primary radiation is in the blue spectral range. A radiation conversion element 3 is arranged on the semiconductor chip 2 and converts primary radiation generated in the semiconductor chip 2 during the operation of the semiconductor component partly into secondary radiation having a second peak wavelength. The semiconductor component 1 thus emits mixed radiation comprising the primary radiation and the secondary radiation.

The semiconductor component 1 furthermore comprises a first contact 61 and a second contact 62. The first contact 61 and the second contact 62 are partial regions of a leadframe. The leadframe is embedded in places in a housing body 6. The semiconductor chip 2 is arranged in a cavity 67 of the housing body 6.

A radiation conversion element 3 having a quantum structure is arranged on the semiconductor chip 2. Various configurations of the radiation conversion element are described with reference to FIGS. 1C to 1G.

Furthermore, two or more, for example three, radiation conversion elements 3 of identical type can also be arranged one above another. In this context, of identical type means that the peak wavelengths of the radiation conversion elements do not differ, or differ only slightly from one another, for example by at most 20 nm. The degree of conversion is thus settable in a simple manner by means of the number of radiation conversion elements.

The radiation conversion element 3 is fixed to the semiconductor chip by means of a fixing layer 8. The fixing layer 8 is expediently formed by means of a material that is transmissive to the primary radiation. By way of example, the fixing layer 8 contains a polymer material, for instance a silicone. Preferably, the refractive index is between 1.5 and the refractive index of the material of the semiconductor chip adjoining the fixing layer. The greater the refractive index of the fixing layer 8, the smaller the proportion of radiation that is reflected at the interface between the semiconductor chip 2 and the fixing layer 8. Such a fixing layer is likewise suitable for the subsequent exemplary embodiments, even if the fixing layer is not shown in all of the figures, for the sake of simplified illustration.

The semiconductor chip 2 and the radiation conversion element 3 are surrounded by a reflector layer 7. The reflector layer in particular directly adjoins the semiconductor chip 2 and the radiation conversion element 3.

The reflector layer 7 is formed for example by means of a polymer material admixed with reflective particles. By way of example, the reflector layer contains a silicone or an epoxy. The particles contain for example titanium oxide, zirconium oxide or aluminum oxide.

The reflector layer 7 is used to avoid a situation where radiation can emerge laterally from the semiconductor chip 2 or the radiation conversion element 3. Therefore, the generated radiation does not impinge on the housing body 6. The material for the housing body can therefore be selected largely independently of its optical properties, for example with regard to a high mechanical stability or a high thermal stability. The fixing of the semiconductor component 1, for example by means of soldering, is thus simplified.

In a vertical direction the semiconductor component 1 extends between an emission side 12 and a mounting side 13 of the semiconductor component, said mounting side being situated opposite the emission side 12.

At the emission side 12 of the semiconductor component 1, the radiation conversion element 3 is free of material of the reflector layer 7 at least in places, preferably completely or substantially completely, for example to the extent of at least 90% of the area of the radiation conversion element.

The first contact 61 and the second contact 62 are formed at the mounting side 13 of the semiconductor component and are electrically conductively connected to the semiconductor chip 2. The semiconductor component is embodied as a surface-mountable semiconductor component.

Figure 1B:
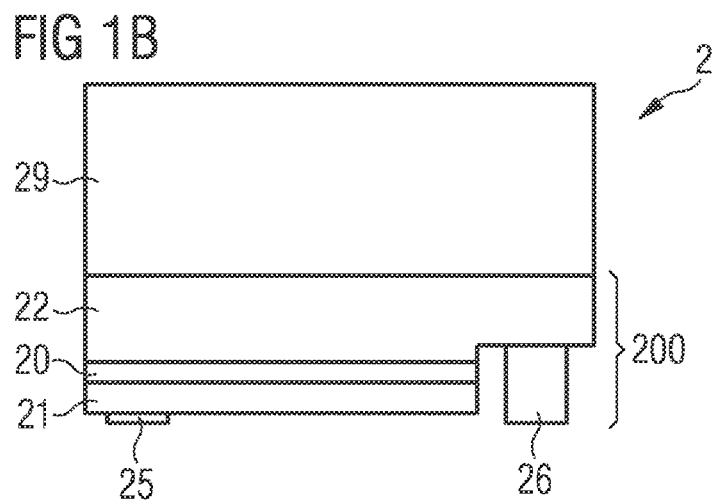
FIG. 1B shows one exemplary embodiment of a semiconductor chip.
Figure 1C:
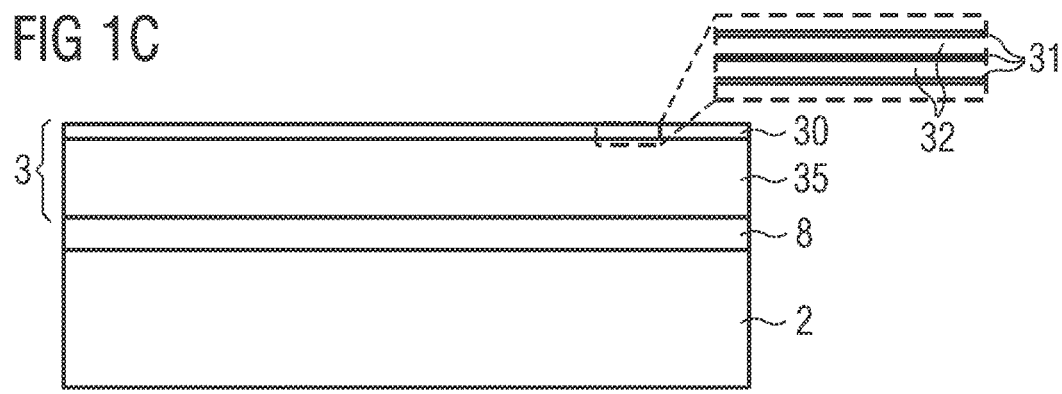
FIGS. 1C to 1G show various exemplary embodiments of a radiation conversion element.

One configuration of the semiconductor chip 2 is shown schematically in FIG. 1B. The semiconductor chip 2 has a first connection area 25 and a second connection area 26 on the rear side facing the mounting side 13. The semiconductor chip 2 comprises a semiconductor body having a semiconductor layer sequence 200 having an active region 20 provided for the radiation generation of the primary radiation. The active region 20 is situated between a first semiconductor layer 21 and a second semiconductor layer 22, wherein the first semiconductor layer and the second semiconductor layer differ from one another with regard to the conduction type at least in places, such that the active region 20 is situated in a pn junction. The in particular epitaxially deposited semiconductor layers of the semiconductor chip 2 are arranged on a carrier 29. In the exemplary embodiment shown, the carrier is a growth substrate for the semiconductor layers of the semiconductor chip. By way of example, the carrier contains sapphire or silicon carbide.

In the exemplary embodiment illustrated in FIG. 1A, the semiconductor chip 2 is mounted in a so-called flip-chip arrangement, such that the first connection area 25 and the second connection area 26 are arranged on the side of the semiconductor component facing the mounting side 13. In a plan view of the semiconductor component, the first contact 61 and the first connection area 25, and also the second contact 62 and the second connection area 26 respectively overlap.

During the production of the semiconductor component 1, the leadframe having the first contact 61 and the second contact 62 can be present in a leadframe assemblage for a multiplicity of semiconductor components. The semiconductor chip 2 is mounted on the leadframe assemblage. Before or after the mounting of the semiconductor chips, a material for the housing body 6 is molded around the leadframe assemblage. The radiation conversion element 3 is applied on the semiconductor chip 2. This can be carried out before or after the semiconductor chips 2 are fixed to the leadframe assemblage. A molding compound for the reflector layer is molded around the semiconductor chips fixed to the leadframe assemblage. The individual semiconductor components 1 arise as a result of a singulation step in which both the leadframe assemblage and the material for the housing bodies are severed. The housing bodies 6 thus arise only upon the singulation of the semiconductor components 1. The side surfaces of the housing body 6 which delimit the semiconductor component 1 in a lateral direction can therefore have singulation traces, for example sawing traces or traces of a laser separation method, at least in places. Such semiconductor components 1 can be produced particularly cost-effectively and compactly.

Exemplary embodiments of the radiation conversion element 3 are shown in an enlarged illustration in FIGS. 1C to 1G. The radiation conversion element 3 comprises a quantum structure 30. The quantum structure comprises quantum layers 31 between which barrier layers 32 are arranged.

The quantum layers 31 and the barrier layers 32 form a multi quantum well structure. In such quantum structures, a quantization takes place within the quantum layers along exactly one spatial direction. Such quantum structures are producible particularly reliably and are distinguished by a high efficiency. However, other quantum structures from among those mentioned in the introduction can also be employed.

The number of quantum layers 31 can be varied within wide limits. By way of example, the quantum structure 30 comprises between two and a hundred quantum layers inclusive, for example fifty quantum layers.

A layer thickness of the quantum layers is preferably between 1 nm and 10 nm inclusive. A layer thickness of the barrier layers 32 is preferably between 3 nm and 100 nm inclusive, for example 15 nm. The barrier layers are preferably embodied in a nominally undoped fashion. In a departure therefrom, however, the barrier layers can also be doped.

For generating green secondary radiation, the quantum layers 31 preferably comprise $Al_xIn_yGa_{1-x-y}N$. By increasing the proportion of indium and/or widening the quantum layers 31, the peak wavelength of the secondary radiation may be increased.

By further increasing the proportion of indium, secondary radiation having a peak wavelength in the yellow or red spectral range may also be achieved. Furthermore, the material system $Al_xIn_yGa_{1-x-y}P$ is also suitable for secondary radiation in the red spectral range.

For peak wavelengths of greater than or equal to 100 nm, the quantum layers are preferably free of aluminum or substantially free of aluminum, for example where $x \leq 0.05$. Furthermore, the indium content y is preferably approximately 50%, for example between 0.45 and 0.55 inclusive, in particular between 0.44 and 0.52 inclusive. Such materials can be deposited epitaxially with high crystal quality on gallium arsenide.

The radiation conversion element 3 furthermore comprises a substrate 35. The substrate 35 can be the growth substrate for the epitaxial deposition of the quantum structure 30. Particularly in the case of a growth substrate that is not radiation-transmissive to the primary radiation, for example in the case of gallium arsenide, the quantum structure 30 can also be transferred to a substrate different than the growth substrate, for example to a glass substrate. In this case, therefore, the substrate is different than a growth substrate for the quantum structure 30 and mechanically stabilizes the quantum structure. The growth substrate is no longer required for this purpose and can be removed, such that the radiation conversion element is free of a growth substrate.

A main extension plane of the substrate 35 runs parallel to a main extension plane of the semiconductor chip, in particular parallel to a main extension plane of the active region of the semiconductor chip. The substrate 35 covers the semiconductor chip 2 over the whole area in the exemplary embodiment shown. In a departure therefrom, a smaller coverage can be expedient. Preferably, the substrate covers the semiconductor chip over a large area, in particular to the extent of at least 20% or to the extent of at least 50%.

Figure 1D:
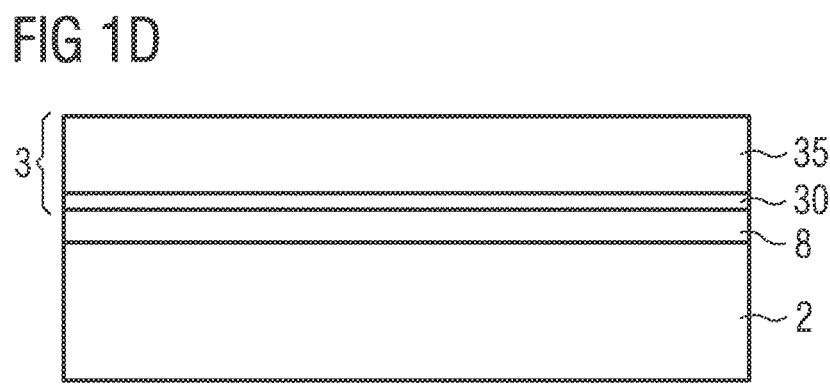

The quantum structure 30 can be arranged on the side of the substrate 35 facing away from the semiconductor chip 2 (FIG. 1C) or on the side of the substrate 35 facing the semiconductor chip 2 (FIG. 1D).

Figure 1E:
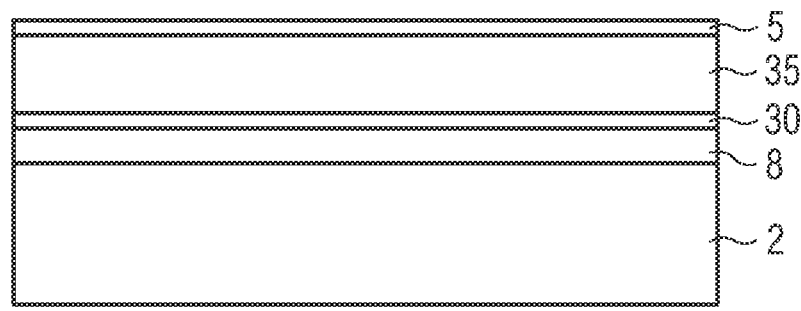

In the exemplary embodiment illustrated in FIG. 1E, a dielectric coating 5 is formed on the radiation conversion element 3, in particular on the side of the substrate 35 facing away from the quantum structure 30. The dielectric coating can be embodied in a multilayered fashion comprising a plurality of layers, wherein adjacent layers of the dielectric coating differ from one another with regard to the refractive index. The dielectric coating 5 can be embodied for example such that the primary radiation is at least partly reflected back into the radiation conversion element 3 and the secondary radiation emerges virtually without being impeded. Furthermore, a resonant cavity for at least one radiation portion, that is to say for the primary radiation and/or the secondary radiation, can be formed by means of the dielectric coating 5.

Figure 1F:
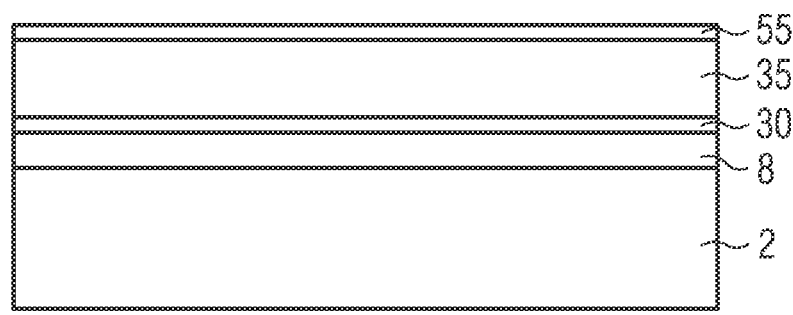
Figure 1G:
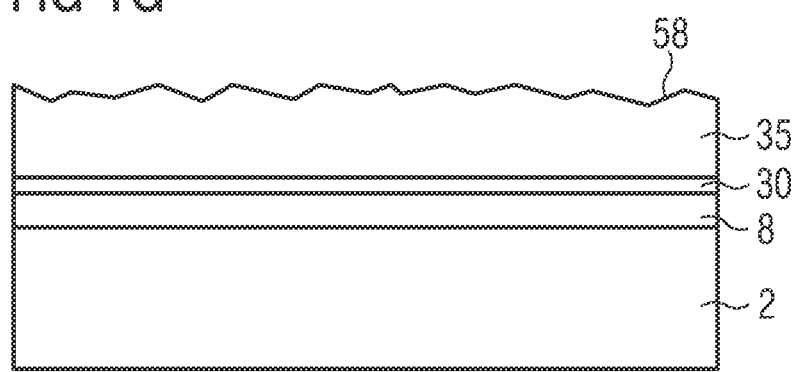

As an alternative to, or to supplement, a dielectric coating 5, it is possible, as illustrated in FIG. 1F, to arrange a scattering layer 55 on the radiation conversion element 3. By way of example, the scattering layer 55 contains a polymer material in which scattering particles are arranged. By way of example, a layer having a thickness of between 10 μm and 30 μm inclusive and having a proportion of scattering particles in percent by weight of between 10% and 30% inclusive, preferably between 15% and 25% inclusive, is suitable. The homogeneity of the emitted radiation with regard to the angle dependence of the color locus can be improved by means of the scattering layer. Furthermore, the scattering in the scattering layer 55 takes place spatially at a distance from the radiation conversion in the quantum structure 30. Radiation conversion and scattering are thus settable largely independently of one another. Furthermore, the radiation conversion element 3, in particular the substrate 35, can comprise a coupling-out structure 58, as is shown in FIG. 1G. In the exemplary embodiment shown, the coupling-out structure is formed on the side of the substrate 35 facing away from the quantum structure 30. The coupling-out structure can be formed for example in an irregular fashion, for instance by means of a roughening.

Alternatively or additionally, the substrate 35 can also have a coupling-out structure on the side facing the quantum structure 30. By way of example, the substrate 35 can be a prestructured substrate, for instance a prestructured sapphire substrate.

In addition to such a coupling-out structure, the radiation conversion element, as described in FIGS. 1E to 1F, can comprise a scattering layer 55 and/or a dielectric coating 5.

The described configurations of the radiation conversion element 3 are also applicable to the exemplary embodiments of a semiconductor component 1 described below. For the sake of simplified illustration, details of the radiation conversion element 3 are not shown in the further figures.

Figure 2A:
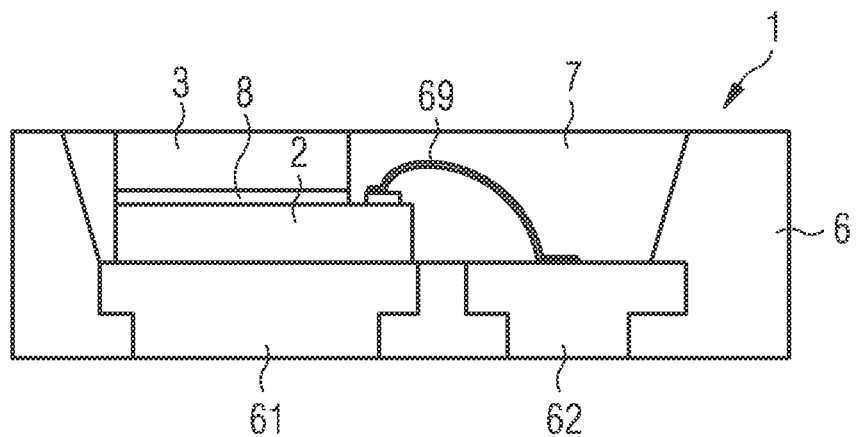
FIG. 2A shows one exemplary embodiment of a semiconductor component.

The exemplary embodiment illustrated in FIG. 2A substantially corresponds to the exemplary embodiment described in association with FIG. 1A. In contrast thereto, the semiconductor chip 2 is embodied as a semiconductor chip in which a connection area is arranged on the front side and a connection area is arranged on the rear side of the semiconductor chip. The side of the semiconductor chip facing the emission side is regarded as the front side.

Figure 2B:
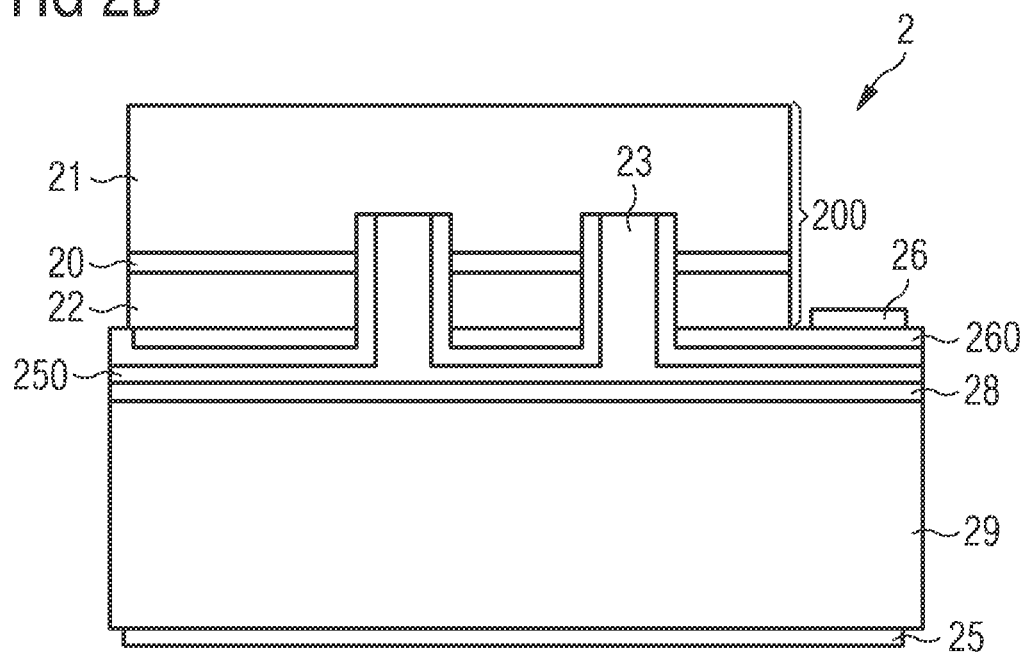
FIG. 2B shows one exemplary embodiment of a semiconductor chip.

FIG. 2B shows one exemplary embodiment of such a semiconductor chip 2. In a departure from the semiconductor chip described in FIG. 1B, the carrier 29 is different than a growth substrate for the semiconductor layers. Such a semiconductor chip is also referred to as a thin-film semiconductor chip. The carrier 29 serves for mechanically stabilizing the semiconductor layers, such that the growth substrate is no longer required for this purpose and can be removed during production. For electrically contacting the first semiconductor layer 21, the semiconductor chip 2 has a plurality of recesses 23 extending through the second semiconductor layer and the active region 20. A first connection layer 250 is arranged in the recesses 23 and is electrically conductively connected to the first semiconductor layer 21. The semiconductor body having the semiconductor layer sequence 200 is fixed to the carrier 29 by means of a connecting layer 28, for example an electrically conductive solder layer or adhesive layer. The electrical contacting of the first semiconductor layer is effected via the first connection layer 250, the connecting layer 28 and the carrier 29 via the first connection area 25. The electrical contacting of the second semiconductor layer is effected via a second connection layer 260 and a front-side second connection area 26. The second connection area 26 is arranged laterally with respect to the semiconductor body 200, with the result that a shading of the active region 20 by radiation-nontransmissive layers for contacting, for example metal layers, is avoided. The second connection area 26 is electrically conductively connected to the second contact 62 via a connecting line 69, for example a wire bond connection. The second connection layer 260 is embodied in particular as a mirror layer for the radiation generated in the active region. In the case of such a semiconductor chip 2, the lateral coupling-out of radiation is reduced in favor of an increased front-side coupling-out of radiation. Even in the absence of a reflector layer laterally adjoining the semiconductor chip, the primary radiation emerges predominantly at the side facing the radiation conversion element.

In the exemplary embodiments described below, both a semiconductor chip as described in association with FIG. 1B and a semiconductor chip as described in association with FIG. 2B can be employed.

The exemplary embodiment illustrated in FIG. 3A substantially corresponds to the exemplary embodiment described in association with FIG. 1A.

In contrast thereto, the semiconductor chip 2 is embedded into an encapsulation 65. The encapsulation 65 is embodied such that it is radiation-transmissive to the primary radiation and the secondary radiation, and so it can also be arranged in the beam path between the semiconductor chip 2 and the emission side 12.

In this exemplary embodiment, the housing body 6, in particular the inner surface of the cavity 67, can also be embodied in a reflective fashion.

The semiconductor component 1 furthermore comprises an emitter 4 in addition to the semiconductor chip 2 and the radiation conversion element 3. In this exemplary embodiment, the emitter 4 is embodied as a further radiation conversion element 41. By way of example, the radiation conversion element 3 is provided for generating secondary radiation in the green spectral range and the further radiation conversion element 41 is provided for generating radiation in the red spectral range. Together with the primary radiation of the semiconductor chip 2 the semiconductor component 1 thus emits radiation having a respective peak wavelength in the red, green and blue spectral ranges.

In the exemplary embodiment shown, the radiation conversion element 3 and the further radiation conversion element 41 are arranged alongside one another on the semiconductor chip 2. The radiation conversion element 3 and the further radiation conversion element 41 can in particular also adjoin one another.

The further radiation conversion element 41 comprises a phosphor for generating a radiation having a third peak wavelength. The phosphor can be embedded for example into a matrix material, for example a silicone or an epoxy. Alternatively, the further radiation conversion element can be embodied as a ceramic comprising the phosphor. Phosphors for generating secondary radiation, for example in the red spectral range, are known per se and are not described in greater detail in the present case.

In addition to the semiconductor chip 2 with narrowband emission and the radiation conversion element 3 with narrowband emission, the semiconductor component 1 comprises an emitter with comparatively broadband emission, for example having a full width at half maximum of 50 nm to 100 nm.

The exemplary embodiment illustrated in FIG. 3B substantially corresponds to the exemplary embodiment described in association with FIG. 3A. In contrast thereto, the housing body 6 is formed by a reflector layer 7 adjoining the semiconductor chip 2, the radiation conversion element 3 and the emitter 4. During the production of the semiconductor component, the housing body is formed by means of a molding compound only after the semiconductor chip 2 with the radiation conversion element 3 and the emitter 4 has already been fixed to the first contact 61 and the second contact 62. Such a semiconductor component 1 can have a particularly small component height, wherein the housing body 6 at the emission side 12 does not extend or at least does not significantly extend beyond the radiation conversion element 3. It goes without saying that such a housing form is also suitable for a semiconductor component 1 which, as described in association with FIG. 1A, does not comprise an emitter 4 in addition to the semiconductor chip 2 and the radiation conversion element 3.

Figure 4A:
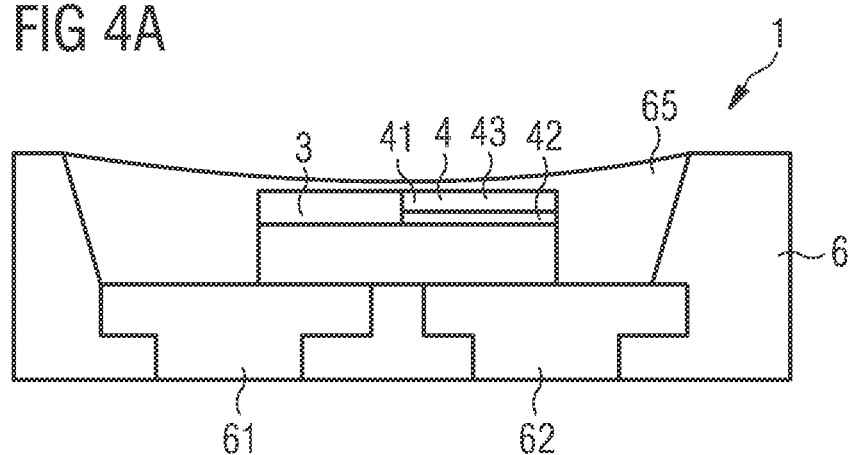
Figure 4B:
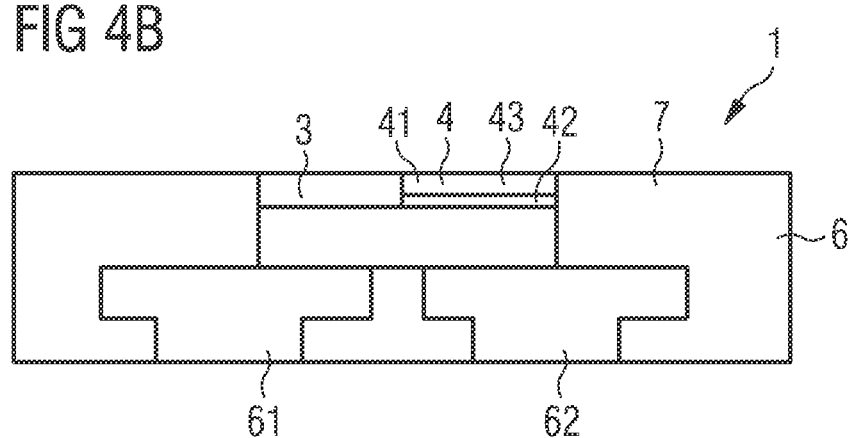

The exemplary embodiments illustrated in FIGS. 4A and 4B substantially correspond to the exemplary embodiments described in association with FIGS. 3A and 3B, respectively. In contrast thereto, the emitter 4 is formed in each case by a further radiation conversion element comprising a further quantum structure 42 arranged on a further substrate 43. The further quantum structure 42 and the further substrate 43 can be embodied as described in association with FIGS. 1C to 1G with regard to the radiation conversion element 3. Such a semiconductor component thus emits three radiation portions having mutually different peak wavelengths, which are in each case particularly narrowband, for example having a full width at half maximum of between 25 nm and 40 nm.

The exemplary embodiments shown in FIGS. 5A and 5B substantially correspond to the exemplary embodiments described in association with FIGS. 3B and 4B, respectively.

In contrast thereto, the emitter 4, that is to say the further radiation conversion element 41 containing phosphor in FIG. 5A and the further quantum structure 42 with the further substrate 43 in FIG. 5B, is optically isolated from the radiation conversion element 3 by means of the reflector layer 7. An optical crosstalk and an associated undesired radiation absorption or excitation of the adjacent radiation conversion element by a radiation transfer between the radiation conversion element 3 and the emitter 4 can thus be avoided. In a plan view of the semiconductor component 1, the reflector layer 7 regionally covers the front side of the semiconductor chip 2 facing the emission side 12.

The exemplary embodiment illustrated in FIG. 6 substantially corresponds to the exemplary embodiment described in association with FIG. 3A. In contrast thereto, the emitter 4 is formed by means of a phosphor embedded into the encapsulation 65. The emitter 4 is thus embodied as a volume converter that emits radiation in particular in the red spectral range. On the emission side 12, the radiation conversion element 3 is free of the encapsulation 65. An undesired absorption of the secondary radiation generated in the radiation conversion element 3 in the emitter 4 is thus reduced. The emitter 4 in the form of the encapsulation with the phosphor adjoins both the semiconductor chip 2 and the radiation conversion element 3.

Furthermore, the semiconductor chip 2 is embodied as a semiconductor chip having two front-side connection areas. The electrical contacting of the semiconductor chip 2 is effected in each case via connecting lines 69. It goes without saying that, in a departure therefrom, a semiconductor chip embodied as described in association with FIG. 1B or 2B can also be employed. Furthermore, the semiconductor chip illustrated in FIG. 6 is also suitable for the further exemplary embodiments.

The exemplary embodiments illustrated in FIGS. 7A and 7B substantially correspond to the exemplary embodiment described in association with Figure A. In contrast thereto, the semiconductor component 1 is free of a leadframe. The first contact 61 and the second contact 62 are formed directly on the semiconductor chip 2. The housing body 6 is formed by a reflector layer 7 molded onto the semiconductor chip 2, the radiation conversion element 3 and the emitter 4. In order to produce such a semiconductor component, the semiconductor chips can be applied on an auxiliary carrier, for example a foil, and a material for the reflector layer 7 can subsequently be molded around them. In particular a molding method, for example foil assisted molding, is suitable for this purpose.

As already described above, a silicone or an epoxy embodied in a reflective fashion is suitable, for example, as material for the reflector layer 7.

In this semiconductor component 1, too, the side surfaces of the semiconductor component 1 arise only upon singulation into individual semiconductor components.

Such semiconductor components are producible particularly compactly and, in terms of their lateral extents, are only slightly larger than the semiconductor chips. Such housing forms are therefore also referred to as CSP (chip size package).

In FIG. 7A, the emitter 4 is formed by a further radiation conversion element containing phosphor. In FIG. 7B, the further radiation conversion element comprises a further quantum structure 42.

The exemplary embodiments described in FIGS. 8A to 8D differ from the previous exemplary embodiments in that the radiation conversion element 3 and the emitter 4, in particular in the form of a further radiation conversion element, are arranged in the vertical direction above the semiconductor chip 2. Both the radiation conversion element 3 and the emitter 4 can thus cover the semiconductor chip 2 over the whole area or substantially over the whole area.

Figure 8A:
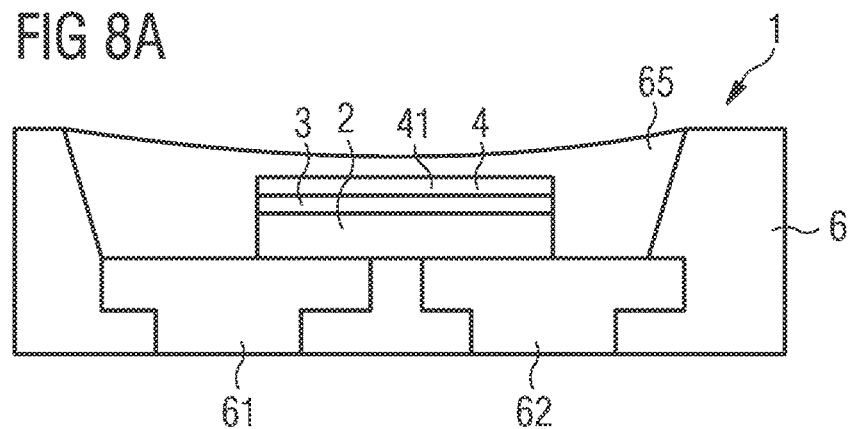
Figure 8B:
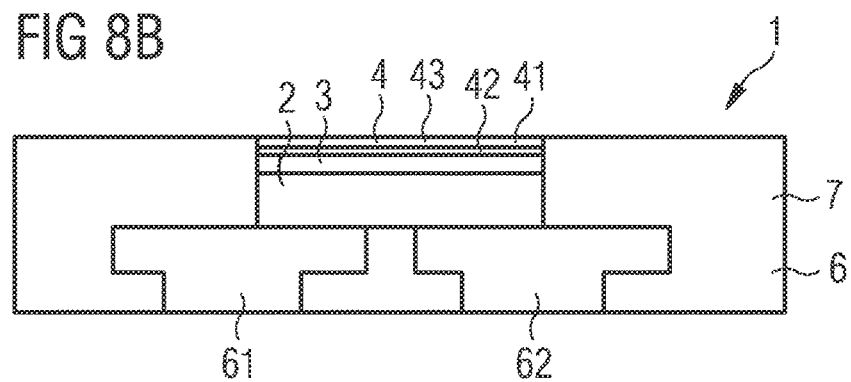

For the rest, the exemplary embodiment illustrated in FIG. 8A corresponds to the exemplary embodiment described in association with FIG. 3A. For the rest, the exemplary embodiment illustrated in FIG. 8B corresponds to the exemplary embodiment described in association with FIG. 4B. In particular, the emitter 4 comprises a further quantum structure 42. In the exemplary embodiment shown, the further quantum structure 42 is arranged on a further substrate 43. The further quantum structure 42 and the quantum structure 30 of the radiation conversion element 3 can thus be produced independently of one another and then be arranged one on top of the other. In a departure therefrom, the further quantum structure 42 and the quantum structure 30 can also be epitaxially deposited in a common semiconductor layer sequence on a common substrate. In this case, therefore, the quantum structure 30 and the further quantum structure 42 are monolithically integrated into a common semiconductor layer sequence and produced in particular in a common epitaxial production method.

Figure 8C:
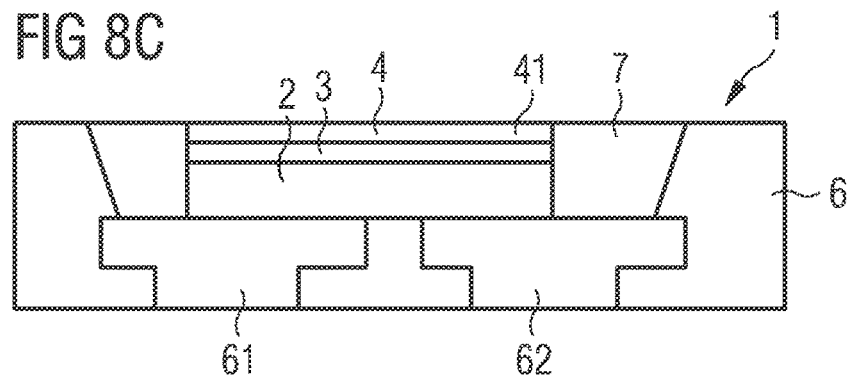

For the rest, the exemplary embodiment illustrated in FIG. 8C corresponds to the exemplary embodiment described in association with FIG. 3B.

Figure 8D:
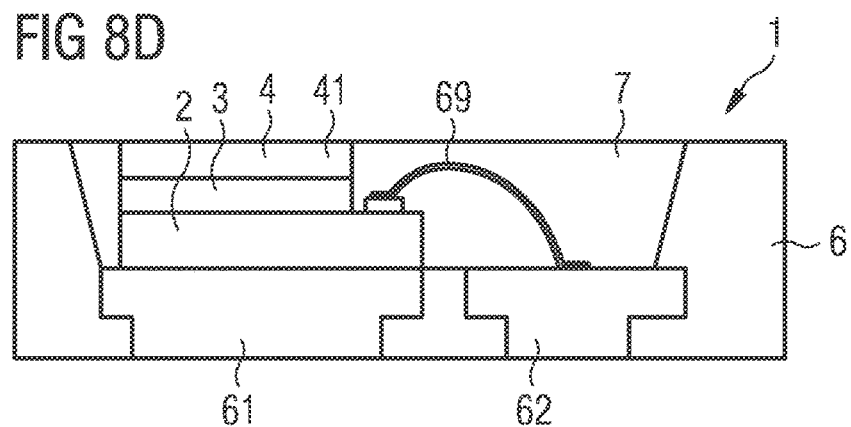

The exemplary embodiment illustrated in FIG. 8D corresponds to the exemplary embodiment described in association with FIG. 2A, apart from the emitter 4 arranged on the radiation conversion element 3.

In the exemplary embodiments illustrated in FIGS. 8C and 8D, too, the emitter 4 can comprise a phosphor or a further quantum structure.

Figure 9:
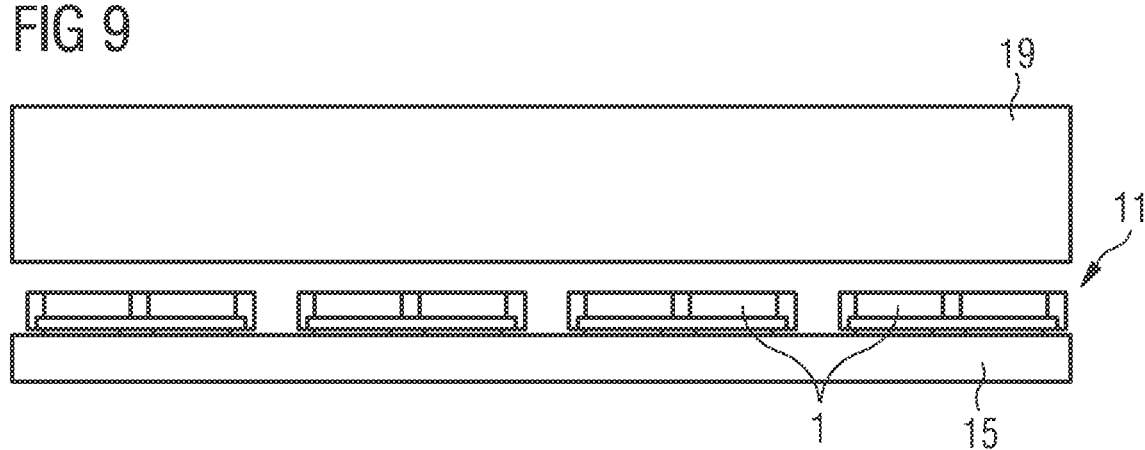
FIG. 9 shows one exemplary embodiment of an illumination device.

FIG. 9 shows one exemplary embodiment of an illumination device 11. The illumination device 11 comprises a plurality of semiconductor components 1 arranged on a connection carrier 15, for example a printed circuit board. The semiconductor components 1 are embodied merely by way of example as described in association with FIG. 7A. The other exemplary embodiments of the semiconductor component 1 can also be used. In the exemplary embodiment shown, the illumination device 11 is designed for coupling radiation into an optical waveguide 19. By way of example, the illumination device 11 serves for the backlighting of a display device, for instance an LCD.

In a departure therefrom, the illumination device 11 can also be designed for a spotlight/headlight or a flashlight or for a projection.

With the exemplary embodiments of the semiconductor components 1 described in the present application, a high gamut with at the same time high efficiency is achievable. The semiconductor components 1 are therefore particularly suitable for such an illumination device 11.

Figure 10A:
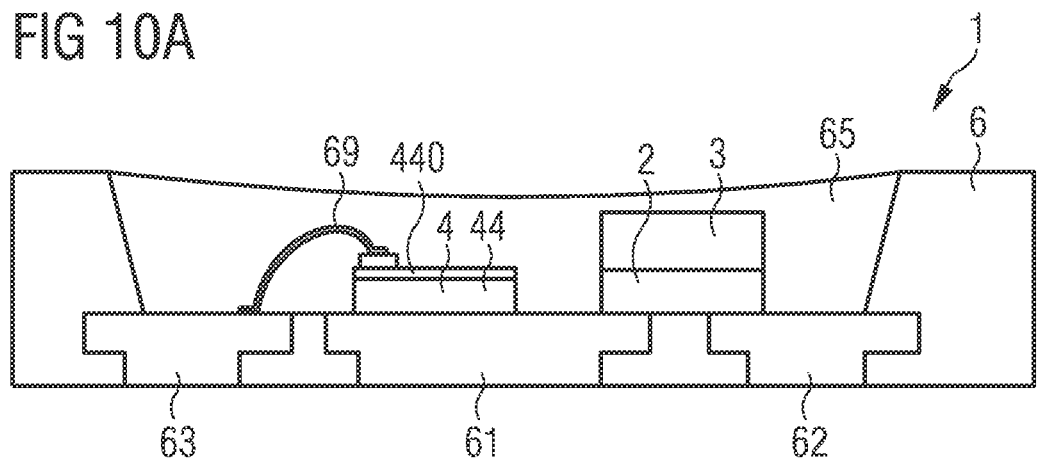
FIGS. 10A, 10B, 11A, 11B and 12 in each case show an exemplary embodiment of a semiconductor component.

The exemplary embodiment illustrated in FIG. 10A substantially corresponds to the exemplary embodiment described in association with FIG. 3A. In contrast thereto, the emitter 4 is embodied as a further semiconductor chip 44. The further semiconductor chip has an active region 440 provided for generating the radiation having the third peak wavelength. In the present exemplary embodiment, the further semiconductor chip emits radiation in the red spectral range. By way of example, the active region of the further semiconductor chip 44 contains $Al_xIn_yGa_{1-x-y}P$ or $Al_xIn_yGa_{1-x-y}As$.

The semiconductor component 1 furthermore comprises a third contact 63 in addition to the first contact 61 and the second contact 62. The first contact 61 serves as a common contact for the semiconductor chip 2 and the further semiconductor chip 44. During the operation of the semiconductor component 1, the semiconductor chip 2 and the further semiconductor chip 44 are operable independently of one another.

Figure 10B:
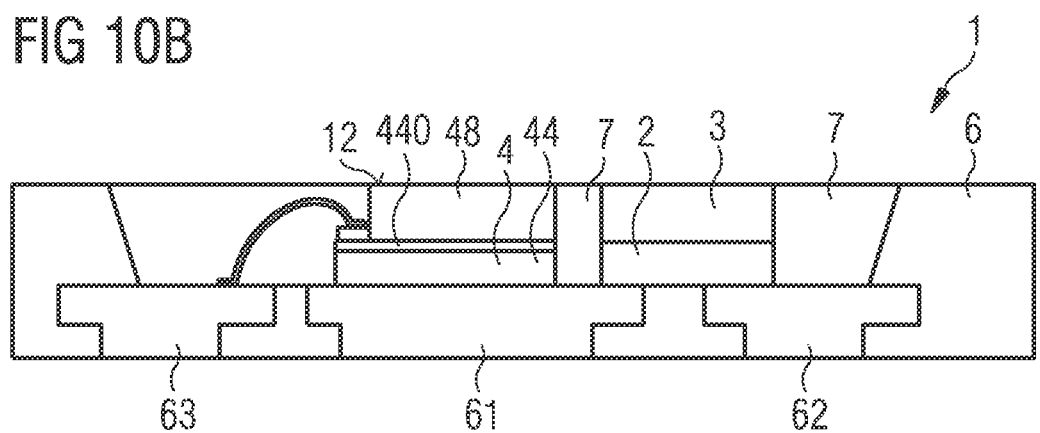

The exemplary embodiment illustrated in FIG. 10B substantially corresponds to the exemplary embodiment described in association with FIG. 5B. In contrast thereto, the semiconductor component 1, as described in association with FIG. 10A, comprises an emitter 4 in the form of a further semiconductor chip 44. A radiation-transmissive body 48 is arranged on the further semiconductor chip 44. By way of example, the radiation-transmissive body contains a glass. The reflector layer 7 adjoins the further semiconductor chip 44, the radiation-transmissive body 48, the semiconductor chip 2 and the radiation conversion element 3. In particular, the further semiconductor chip 44 and the radiation-transmissive body 48 are optically isolated from the semiconductor chip 2 and the radiation conversion element 3 by the reflector layer 7. By means of the radiation-transmissive body 48, the reflector layer 7 can be embodied in a simplified manner such that the further semiconductor chip 44 is not covered by the reflector layer 7. In particular, the radiation-transmissive body 48 and the radiation conversion element 3 at the emission side 12 end at the same height or substantially at the same height.

In other words, the top sides—facing the emission side 12—of the radiation-transmissive body 48 and of the radiation conversion element 3 run in one plane.

Figure 11A:
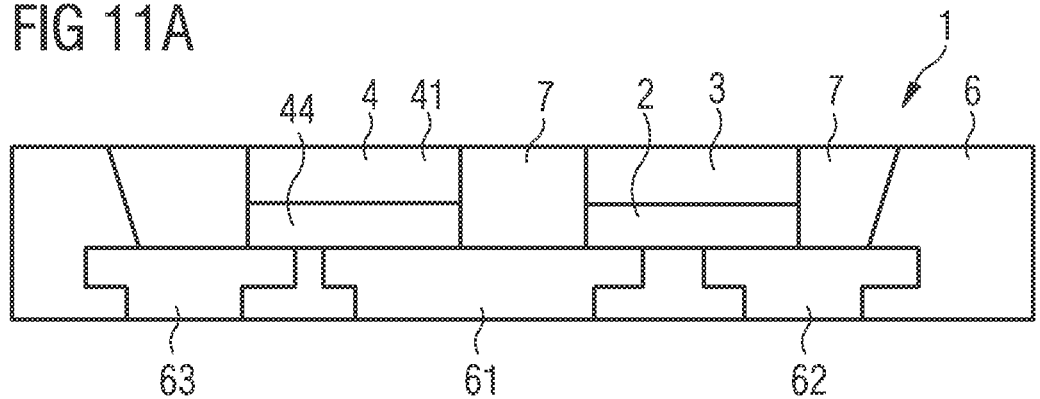

The exemplary embodiment described in FIG. 11A substantially corresponds to the exemplary embodiment described in association with FIG. 5A. In contrast thereto, the emitter 4 embodied as a further radiation conversion element 41 is not arranged on the semiconductor chip 2, but rather on a further semiconductor chip 44. The further semiconductor chip 44 can emit radiation in particular with the same peak wavelength as the semiconductor chip 2. During the operation of the semiconductor component, the ratio of the radiation emitted by the emitter 4 and the radiation emitted by the radiation conversion element 3, in contrast to the exemplary embodiment illustrated in FIG. 5A, is settable by different driving of the semiconductor chip 2 and of the further semiconductor chip 44. The further semiconductor chip 44 and the emitter 4 are optically decoupled from the semiconductor chip 2 and the radiation conversion element 3 by the reflector layer 7.

Figure 11B:
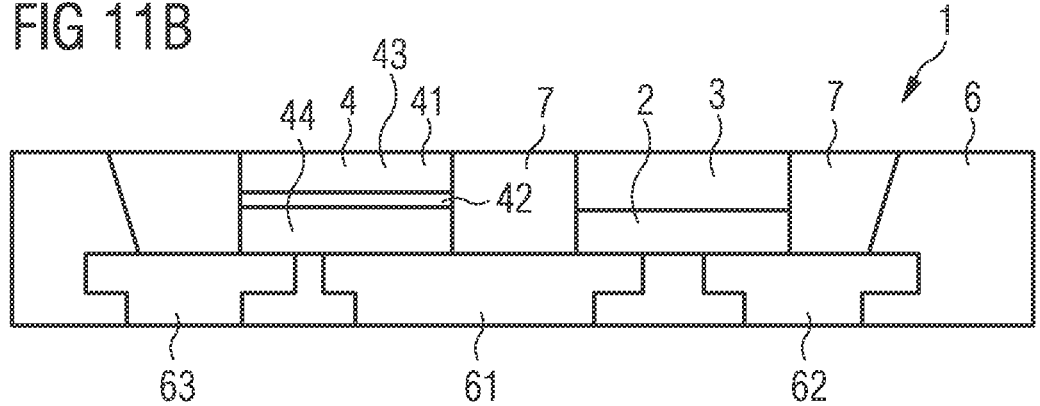

As an alternative to the exemplary embodiment illustrated in FIG. 11A, the emitter 4 can also be formed by means of a further quantum layer 42 on a further substrate 43, as illustrated in FIG. 11B.

Figure 12:
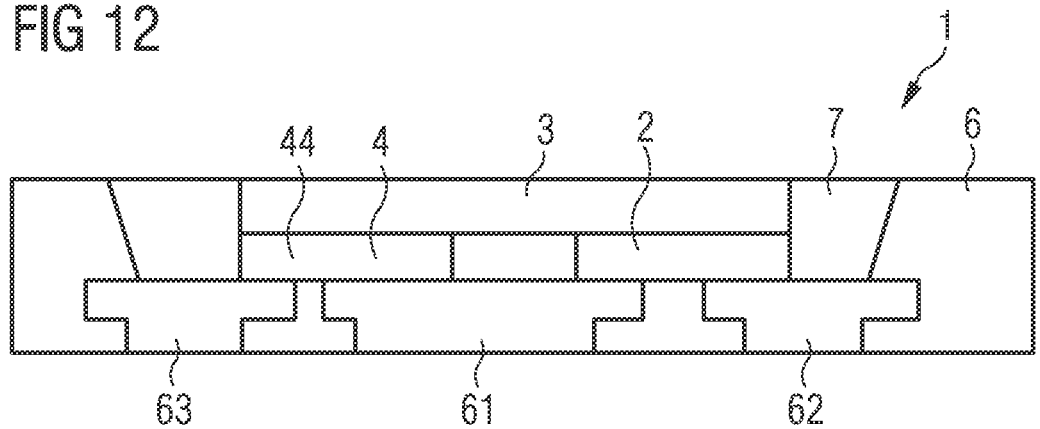

The exemplary embodiment illustrated in FIG. 12 substantially corresponds to the exemplary embodiment described in association with FIG. 10A. In contrast thereto, the radiation conversion element 3 in a plan view of the semiconductor component 1 extends both over the semiconductor chip 2 and over the further semiconductor chip 44. A radiation-transmissive body 48 on the further semiconductor chip 44 is therefore not necessary. Expediently, the peak wavelength of the further semiconductor chip 44 is of a magnitude such that the emitted radiation is not or at least not significantly absorbed upon passing through the radiation conversion element 3.

By way of example, the radiation conversion element 3 is provided for absorbing radiation in the blue spectral range and for emitting radiation in the green spectral range. Radiation in the red spectral range emitted by the further semiconductor chip 44 is therefore not absorbed by the radiation conversion element 3.

Furthermore, in contrast to FIG. 10A, the further semiconductor chip 44 is embodied as a flip-chip, such that a front-side contacting of the semiconductor chip is not necessary. The large-area arrangement of the radiation conversion element on the semiconductor chip 2 and the further semiconductor chip 44 is thus simplified.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims and in the exemplary embodiments.

The invention claimed is:
1. A semiconductor component comprising:
 a first semiconductor chip configured to generate a primary radiation having a first peak wavelength; and
 a first radiation conversion element arranged on the first semiconductor chip, the first radiation conversion element comprising:
  a quantum structure that converts the primary radiation at least partly into secondary radiation having a second peak wavelength; and a substrate which is transmissive to the primary radiation and serves for mechanically stabilizing the quantum structure;
wherein the first radiation conversion element has a coupling-out structure that is a structured growth area of the substrate disposed on a side of the substrate facing the quantum structure, wherein the substrate is a growth substrate for epitaxial deposition of the quantum structure and is arranged between the first semiconductor chip and the quantum structure.

2. The semiconductor component according to claim 1, wherein the first radiation conversion element contains AlxInyGa1-x-yN, AlxInyGa1-x-yP or AlxInyGa1-x-yAs.

3. The semiconductor component according to claim 1, wherein the first peak wavelength is less than the second peak wavelength.

4. The semiconductor component according to claim 1, wherein the semiconductor component comprises an emitter configured to emit radiation having a third peak wavelength.

5. The semiconductor component according to claim 4, wherein a reflector layer is arranged in a beam path between the emitter and the first radiation conversion element.

6. The semiconductor component according to claim 4, wherein the emitter is a second radiation conversion element.

7. The semiconductor component according to claim 6, wherein the first radiation conversion element and the second radiation conversion element are arranged alongside one another or one above the other on the first semiconductor chip.

8. The semiconductor component according to claim 6, wherein the semiconductor component comprises a second semiconductor chip, and wherein the second radiation conversion element is arranged on the second semiconductor chip.

9. The semiconductor component according to claim 6, wherein the second radiation conversion element comprises a phosphor embedded into an encapsulation of the first semiconductor chip.

10. The semiconductor component according to claim 4, wherein the emitter is a second semiconductor chip, and wherein the second semiconductor chip has an active region for generating the third peak wavelength.

11. The semiconductor component according to claim 10, wherein the first semiconductor chip and the second semiconductor chip are embedded into a reflector layer,
wherein a body that is radiation-transmissive to the third peak wavelength is arranged on the second semiconductor chip,
wherein the reflector layer adjoins the radiation-transmissive body and the first radiation conversion element, and
wherein the radiation-transmissive body and the first radiation conversion element are at least regionally free of the reflector layer on an emission side of the semiconductor component.

12. The semiconductor component according to claim 1, wherein a dielectric coating is arranged on the first radiation conversion element, and wherein the dielectric coating has a wavelength-selective transmission.

13. The semiconductor component according to claim 1, wherein a scattering layer is arranged on the first radiation conversion element.

14. The semiconductor component according to claim 1, wherein the quantum structure is arranged on a side of the substrate facing the first semiconductor chip.

15. An illumination device comprising:
a connection carrier; and
at least one semiconductor component according to claim 1, wherein the at least one semiconductor component is arranged on the connection carrier.

16. The illumination device according to claim 15, wherein the illumination device is designed for backlighting of a display device, for a projection, for a flashlight or for a spotlight/headlight.

17. A semiconductor component comprising:
a semiconductor chip configured to generate a primary radiation having a first peak wavelength;
a first radiation conversion element arranged on the semiconductor chip, wherein the first radiation conversion element comprises a first quantum structure that converts the primary radiation at least partly into secondary radiation having a second peak wavelength, wherein the first radiation conversion element comprises a first substrate that is transmissive to the primary radiation, wherein the first radiation conversion element has a coupling-out structure that is one of a structured growth area of the first substrate disposed on a side of the first substrate facing the first quantum structure, or a roughening of the first substrate disposed on a side of the first substrate facing away from the first quantum structure; and
an emitter for emitting radiation having a third peak wavelength, the emitter being a second radiation conversion element,
wherein the first and second radiation conversion elements are arranged one above the other on the semiconductor chip, and
wherein the second radiation conversion element comprises a second quantum structure arranged on a second substrate.

18. The semiconductor component according to claim 17, wherein the semiconductor component comprises a reflector layer, the reflector layer directly adjoining the semiconductor chip and the first radiation conversion element.

19. The semiconductor component according to claim 18, wherein the reflector layer adjoins the second radiation conversion element.

20. The semiconductor component according to claim 1, wherein the quantum structure comprises a plurality of quantum layers and barrier layers stacked one above the other in a vertical direction, the vertical direction extending perpendicular to an emission side of the semiconductor component.

21. The semiconductor component according to claim 1, wherein the quantum structure and the substrate have the same lateral extent.

22. The semiconductor component according to claim 1, wherein the substrate is a growth substrate for an epitaxial deposition of the quantum structure.

23. A semiconductor component comprising:
a semiconductor chip provided for generating a primary radiation having a first peak wavelength; and
a radiation conversion element arranged on the semiconductor chip and comprising a quantum structure and a substrate transmissive to the primary radiation, wherein the radiation conversion element has a coupling-out structure that is a structured growth area of the substrate disposed on a side of the substrate facing the quantum structure, wherein the substrate is a growth substrate for epitaxial deposition of the quantum structure and is arranged between first semiconductor chip and the quantum structure;

wherein the semiconductor chip comprises a carrier on which a semiconductor body comprising an active region is arranged;
wherein the active region is provided for generating the primary radiation;
wherein the carrier mechanically stabilizes the semiconductor body;
wherein the quantum structure is configured for converting the primary radiation at least partly into secondary radiation having a second peak wavelength;
wherein the quantum structure comprises a plurality of quantum layers between which barrier layers are arranged, wherein the quantum layers and the barrier layers form a multi-quantum-well structure in which charge carriers experience a quantization of their energy states as a result of confinement; and
wherein the substrate serves for mechanically stabilizing the quantum structure.

* * * * *